US010737935B2

(12) United States Patent
Dehe et al.

(10) Patent No.: US 10,737,935 B2
(45) Date of Patent: Aug. 11, 2020

(54) MEMS SENSORS, METHODS FOR PROVIDING SAME AND METHOD FOR OPERATING A MEMS SENSOR

(71) Applicant: Infineon Technologies AG, Neubiberg (DE)

(72) Inventors: Alfons Dehe, Villingen-Schwenning (DE); Marc Fueldner, Neubiberg (DE); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/050,795

(22) Filed: Jul. 31, 2018

(65) Prior Publication Data

US 2019/0039884 A1 Feb. 7, 2019

(30) Foreign Application Priority Data

Aug. 1, 2017 (DE) .......................... 10 2017 213 277

(51) Int. Cl.
*B81B 7/02* (2006.01)
*B81B 3/00* (2006.01)
(Continued)

(52) U.S. Cl.
CPC ............. *B81B 7/02* (2013.01); *B81B 3/0027* (2013.01); *B81B 3/0086* (2013.01);
(Continued)

(58) Field of Classification Search
CPC .... B81B 2201/0257; B81B 2201/0264; B81B 2203/0127; B81B 2203/04;
(Continued)

(56) References Cited

U.S. PATENT DOCUMENTS 6,075,867 A * 6/2000 Bay ..................... H04R 19/04
381/191
9,602,930 B2 3/2017 Park
(Continued)

FOREIGN PATENT DOCUMENTS

DE 102014212340 A1 1/2015
DE 102015104879 A1 10/2015

OTHER PUBLICATIONS http://claus-brell.de/Bilder/Bauan leitungen/MikrofonVorverstaerker_Circuit_Ciaus_Brell.jpg", accessed via the web archive, https:Uweb.archive.org" with the status vern Jun. 1, 2017, 1 page.

*Primary Examiner* — Duy T Nguyen
(74) *Attorney, Agent, or Firm* — Slater Matsil, LLP

(57) ABSTRACT

In accordance with an embodiment, a MEMS sensor includes a MEMS arrangement having a movable electrode and a stator electrode arranged opposite the movable electrode. The MEMS sensor includes a first bias voltage source, which is connected to the stator electrode and which is configured to apply a first bias voltage to the stator electrode. The MEMS sensor further includes a common-mode readout circuit connected to the stator electrode by a capacitive coupling and comprising a second bias voltage source, which is configured to apply a second bias voltage to a side of the capacitive coupling that faces away from the stator electrode.

21 Claims, 9 Drawing Sheets

(51) Int. Cl.
| | |
|---|---|
| *H04R 3/06* | (2006.01) |
| *H04R 19/00* | (2006.01) |
| *H04R 19/04* | (2006.01) |
| *G01L 9/00* | (2006.01) |
| *G01L 19/06* | (2006.01) |
| *G01L 19/02* | (2006.01) |
| *G01L 9/12* | (2006.01) |

(52) U.S. Cl.
CPC .............. *G01L 9/0041* (2013.01); *G01L 9/12* (2013.01); *G01L 19/02* (2013.01); *G01L 19/06* (2013.01); *H04R 3/06* (2013.01); *H04R 19/005* (2013.01); *H04R 19/04* (2013.01); *B81B 2201/0257* (2013.01); *B81B 2201/0264* (2013.01); *B81B 2203/0127* (2013.01); *B81B 2203/04* (2013.01); *B81B 2207/03* (2013.01); *H04R 2201/003* (2013.01)

(58) Field of Classification Search
CPC . B81B 2207/03; B81B 3/0027; B81B 3/0086; B81B 7/02; G01L 19/02; G01L 19/06; G01L 9/0041; G01L 9/12; H04R 19/005; H04R 19/04; H04R 2201/003; H04R 3/06
USPC .......................................................... 257/415
See application file for complete search history.

(56) References Cited

U.S. PATENT DOCUMENTS

| | | | |
|---|---|---|---|
| 2005/0229710 | A1 | 10/2005 | O'Dowd et al. |
| 2015/0001647 | A1* | 1/2015 | Dehe ................ B81B 3/0021 257/416 |
| 2015/0276529 | A1* | 10/2015 | Wiesbauer .......... G01L 9/0042 73/724 |
| 2016/0223579 | A1* | 8/2016 | Froemel .................. G01P 5/14 |
| 2016/0295328 | A1* | 10/2016 | Park ........................ H04R 1/08 |

* cited by examiner

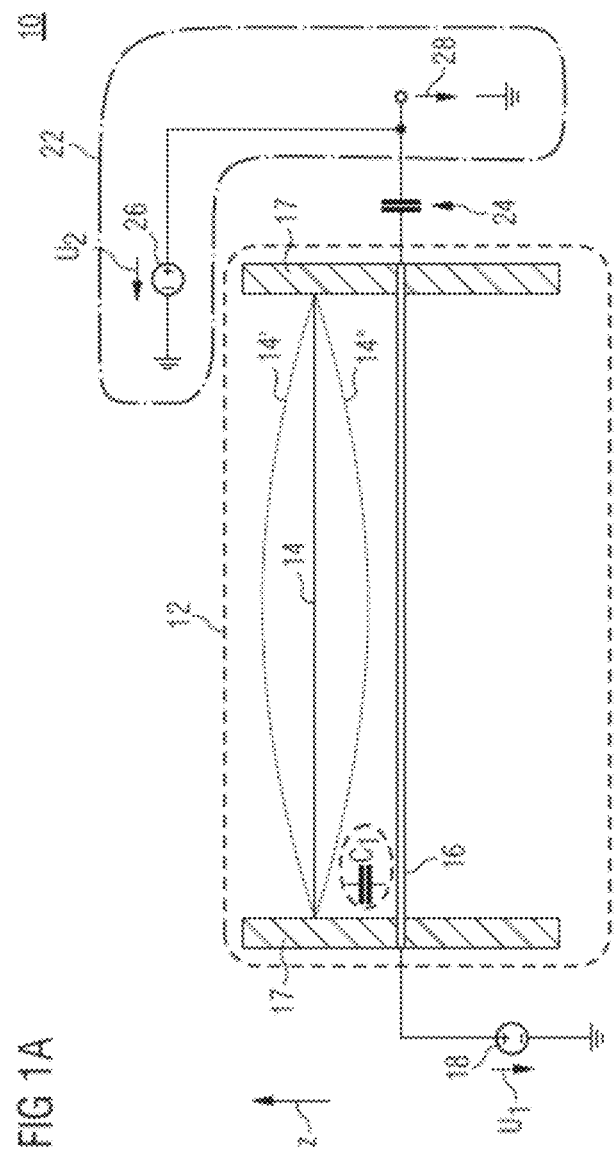

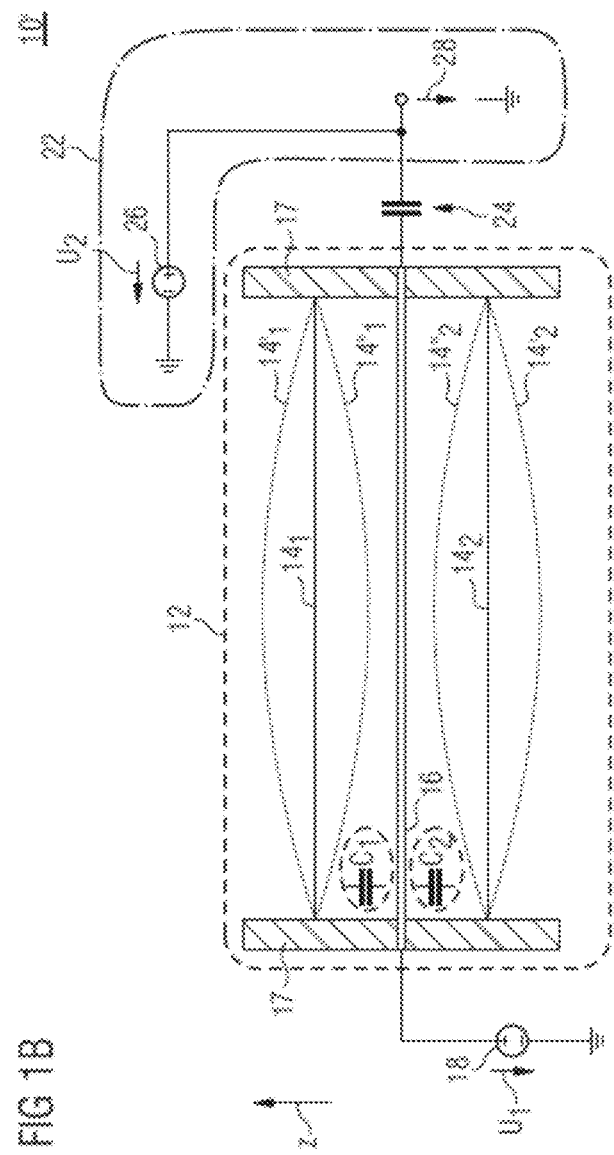

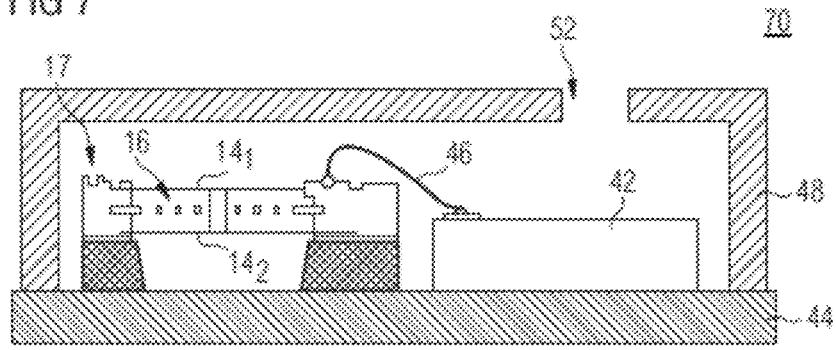
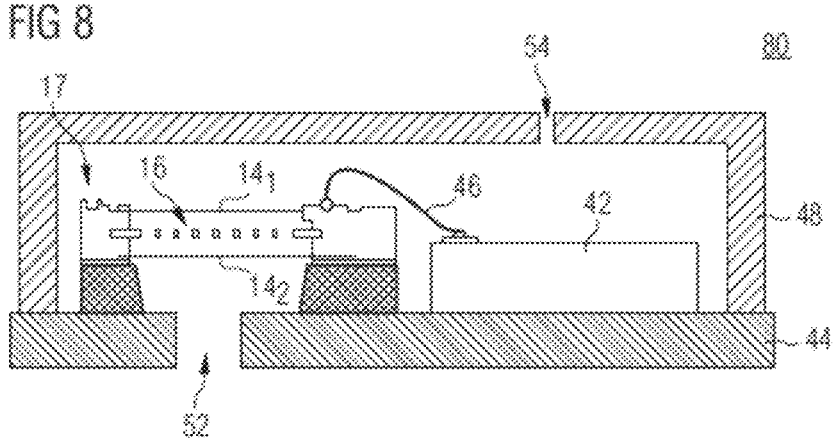
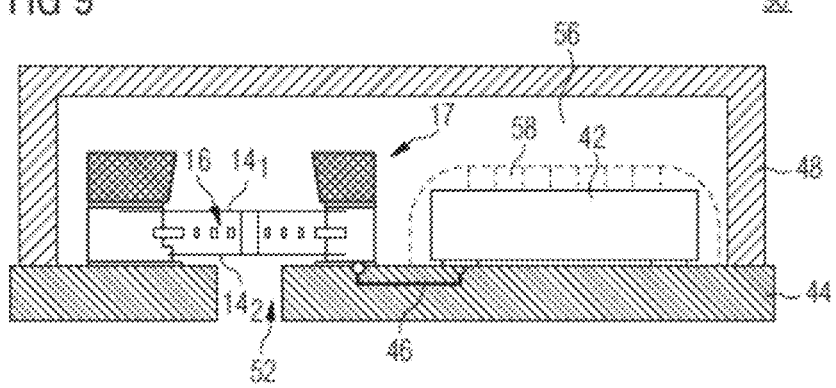

MEMS SENSORS, METHODS FOR PROVIDING SAME AND METHOD FOR OPERATING A MEMS SENSOR

This application claims the benefit of German Application No. 102017213277.9, filed on Aug. 1, 2017, which application is hereby incorporated herein by reference in its entirety.

TECHNICAL FIELD

The present invention relates generally to a system and method for an electronic system, and, in particular embodiments, to micro-electro-mechanical (MEMS) sensors, methods for providing MEMS sensors, and methods for operating a MEMS sensor.

BACKGROUND

MEMS sensors can utilize different physical effects in order to carry out sensor-based measurements. One example thereof is the deflection of a membrane, for instance as a result of contact with a fluid, that is to say a liquid and/or a gas. MEMS sensors of this type can be formed on the basis of a semiconductor technology, that is to say that they can comprise semiconductor materials such as silicon and/or gallium arsenide, for example. Moreover, further materials can be arranged which enable a corresponding functionalization and/or passivation, for instance conducting materials such as metals and/or passivating materials such as silicon oxide and/or silicon nitride.

MEMS sensors that are robust vis-á-vis an environment in which they are used would be desirable.

SUMMARY

Exemplary embodiments provide a MEMS sensor comprising a MEMS arrangement having a movable electrode. A stator electrode is arranged opposite the movable electrode. The MEMS sensor comprises a first bias voltage source, which is connected to the stator electrode and which is configured to apply a first bias voltage to the stator electrode. The MEMS sensor comprises a common-mode read-out circuit connected to the stator electrode by a capacitive coupling and comprising a second bias voltage source, which is configured to apply a second bias voltage to a side of the capacitive coupling that faces away from the stator electrode.

In accordance with one exemplary embodiment the movable electrode is a first movable electrode. The MEMS sensor comprises a second movable electrode, which is arranged opposite the first movable electrode, wherein the stator electrode is arranged between the first and second movable electrodes. What is thereby achieved in interplay with the common-mode read-out circuit is that movable electrodes moving toward or away from one another in each case make an additive contribution to a measurement signal obtained by the common-mode read-out circuit, in contrast to mutually compensating contributions. This makes it possible to obtain robust MEMS sensors.

A further exemplary embodiment provides a MEMS sensor comprising a MEMS arrangement comprising a first movable electrode, a second movable electrode arranged opposite the first movable electrode, and a stator electrode arranged between the first and second movable electrodes. The MEMS sensor is formed such that the first movable electrode in a rest state is arranged at a first distance from the stator electrode and the second electrode in the rest state is arranged at a second distance from the stator electrode, said second distance being different than the first distance. This leads to different contributions in a capacitive change between the first movable electrode and the stator electrode and between the second movable electrode and the stator electrode, such that influences on the MEMS sensor as a result of external disturbances such as, for instance, particles, pressures or varying temperatures in the different partial measurements bring about different changes and a high insensitivity to disturbances is obtained on the basis thereof, which likewise enables a robust MEMS sensor.

A further exemplary embodiment provides a method for providing a MEMS sensor. The method comprises providing a MEMS arrangement having a first movable electrode, a second movable electrode arranged opposite the first movable electrode, and a stator electrode arranged between the first and second movable electrodes. The method comprises connecting a first bias voltage source to the stator electrode, such that the first bias voltage source is configured to apply a first bias voltage to the stator electrode. The method comprises connecting a common-mode read-out circuit comprising a second bias voltage source by a capacitive coupling to the stator electrode, such that the second bias voltage source is configured to apply a second bias voltage to a side of the capacitive coupling that faces away from the stator electrode.

A further exemplary embodiment provides a further method for providing a MEMS sensor. The method comprises providing a MEMS arrangement comprising a first movable electrode, a second movable electrode arranged opposite the first movable electrode, and a stator electrode arranged between the first and second movable electrodes. Providing the MEMS arrangement is carried out such that the first movable electrode in a rest state is arranged at a first distance from the stator electrode and the second electrode in the rest state is arranged at a second distance from the stator electrode, said second distance being different than the first distance.

A further exemplary embodiment provides a method for controlling a MEMS sensor comprising a first movable electrode, a second movable electrode arranged opposite the first movable electrode, and a stator electrode arranged between the first and second movable electrodes. The method comprises applying a first bias voltage to the stator electrode and applying a second bias voltage to the stator electrode via a capacitive coupling to the stator electrode and at a side of the capacitive coupling that faces away from the stator electrode.

BRIEF DESCRIPTION OF THE DRAWINGS

Exemplary embodiments are explained below with reference to the accompanying drawings, in which:

FIG. 1a shows a schematic lateral sectional view of a MEMS sensor in accordance with one exemplary embodiment comprising one movable electrode;

FIG. 1b shows a schematic lateral sectional view of a MEMS sensor in accordance with one exemplary embodiment, which is constructed similarly to the MEMS sensor from FIG. 1a and comprises a second movable electrode;

FIG. 7 shows a schematic lateral sectional view of a MEMS sensor in accordance with one exemplary embodiment, which is embodied as a so-called top port microphone;

FIG. 8 shows a schematic lateral sectional view of a MEMS sensor in accordance with one exemplary embodiment, which is embodied as a bottom port microphone compared with the MEMS sensor from FIG. 7;

FIG. 9 shows a schematic lateral sectional view of a MEMS sensor in accordance with one exemplary embodiment, wherein an electrical connection is integrated into a printed circuit board;

DETAILED DESCRIPTION OF ILLUSTRATIVE EMBODIMENTS

Figure 2:
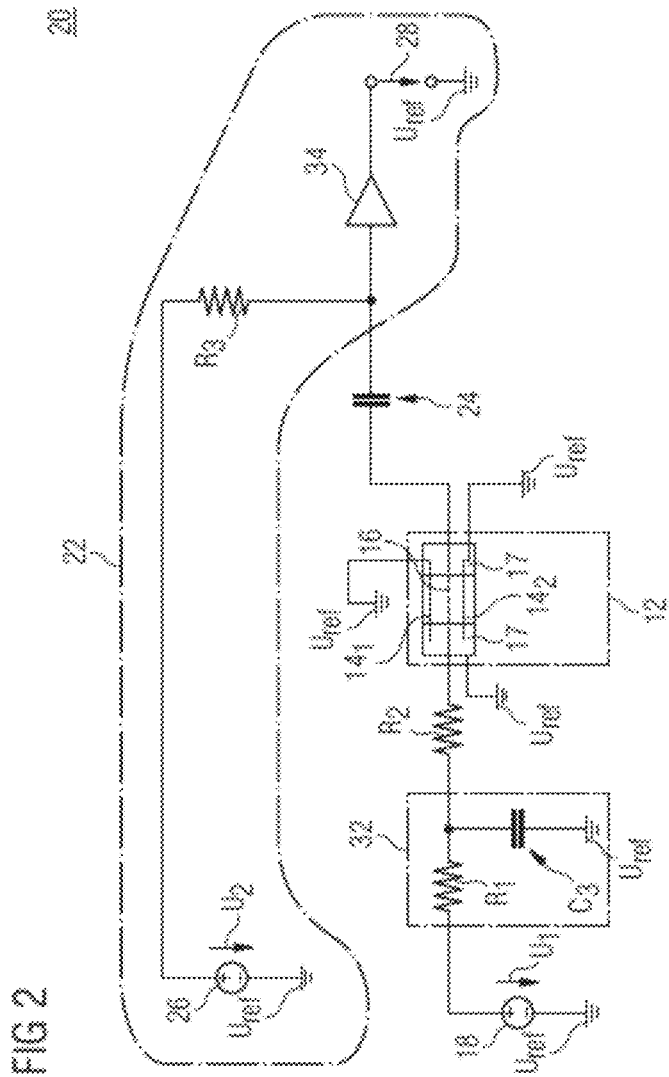
FIG. 2 shows a schematic block diagram of a MEMS sensor in accordance with one exemplary embodiment, wherein the movable electrodes are connected to a reference potential.

Before exemplary embodiments are more specifically explained below in detail with reference to the drawings, it is pointed out that identical, functionally identical or identically acting elements, objects and/or structures in the various figures are provided with the same reference signs, such that the description of said elements represented in the various exemplary embodiments is mutually interchangeable or can be applied to one another.

Some embodiments of the present disclosure relate to MEMS sensors, in particular MEMS sensors for interacting with a fluid, such as MEMS microphones or MEMS pressure sensors, for example. Embodiments of the present disclosure further relate to methods for providing MEMS sensors of this type, and to a method for operating a MEMS sensor. The present disclosure furthermore describes embodiments directed to a robust read-out of a MEMS microphone.

Exemplary embodiments below relate to MEMS sensors, in particular such sensors which are contactable with a fluid, for instance in order to detect a pressure and/or a pressure profile of the fluid, i.e. to MEMS microphones and MEMS pressure sensors. Some of the exemplary embodiments below furthermore relate to such MEMS sensors which comprise a stator electrode that is comparatively immobile, that is to say is embodied such that it carries out a comparatively small travel in relation to other electrodes. The stator electrode is arranged between a first and a second movable electrode, such that a movement of the first movable electrode relative to the stator electrode and a movement of the second movable electrode relative to the stator electrode lead to a change in a capacitance value between the respective electrode pair.

An ambient fluid, for instance air, can be arranged between the movable electrodes. Alternatively, it is possible for a closed volume to be present between the two movable electrodes, in which closed volume for example a reference fluid, a reference pressure and/or a vacuum are/is arranged. The movable electrodes can be mechanically connected to one another via supporting structures, for instance in order to reduce a change in a distance between the two movable electrodes as a result of an external pressure or the like.

A material for the stator electrode and/or the movable electrodes can be for example a doped semiconductor material such as silicon for instance. As doping materials it is possible to use arbitrary materials suitable for this purpose, for instance boron or phosphorus. Alternatively or additionally, it is likewise possible to apply a conductive coating on a possibly nonconductive semiconductor material, for instance by deposition or vapor deposition of a metal material. The stator electrode can be formed in a similar way, wherein said stator electrode can be formed with a low mobility by means of structural measures, for instance an increased thickness. A respective insulation layer can be arranged between two mutually related electrodes, i.e. the first movable electrode and the stator electrode, and the second movable electrode and the stator electrode, said insulation layer avoiding a short circuit in the case of mechanical contact. An insulation layer of this type can comprise for example a silicon oxide material or a silicon nitride material.

FIG. 1a shows a schematic lateral sectional view of a MEMS sensor 10 in accordance with one exemplary embodiment. The MEMS sensor 10 comprises a MEMS arrangement 12 having a movable electrode 14 and a stator electrode 16. The stator electrode 16 can be arranged opposite the movable electrode. The movable electrode 14 can be deflectable along a direction z in a positive and/or negative direction of same and thus approach or move away from the stator electrode 16, such that functionality in accordance with a variable plate capacitor and in accordance with a microphone or pressure sensor is obtained.

A movement or deflection of the movable electrode 14 is indicated by dashed lines provided with the reference signs 14' and 14", wherein 14' can denote a movement of the movable electrode 14 away from the stator electrode 16 while the reference sign 14" can denote a movement toward the stator electrode 16.

The movable electrode 14 and/or the stator electrode 16 can be held opposite one another by a substrate 17 and/or be mechanically fixedly connected thereto. The substrate 17 can comprise a semiconductor material, for example.

The MEMS sensor 10 comprises a bias voltage source 18, which is connected to the stator electrode 16 and is configured to apply a first bias voltage $U_1$ to the stator electrode 16.

The MEMS sensor 10 furthermore comprises a common-mode read-out circuit 22, which is likewise electrically connected to the stator electrode 16 via a capacitive coupling 24. Although the stator electrode 16 is illustrated such that the bias voltage source 18 and the common-mode read-out circuit 22 are electrically connected to the stator electrode 16 at different locations, it is possible for the capacitive coupling also to be implemented spatially adjacent to the bias voltage source 18, for instance by connection of the capacitive coupling 24 in a path between the bias voltage source 18 and the stator electrode 16 and also an arrangement of the common-mode read-out circuit 22 via the capacitive coupling to the stator electrode 16. The common-mode read-out circuit 22 can have a second bias voltage source 26, which is configured to apply a bias voltage $U_2$ to the stator electrode 16 via the capacitive coupling 24. For this purpose, the bias voltage source 26 is connected to the capacitive coupling 24 at a side of the capacitive coupling 24 that faces away from the stator electrode 16. The common-mode read-out circuit 22 can be configured to provide a measurement signal 28 that indicates information regarding a movement of the movable electrode 14 relative to the stator electrode 16.

Compared with a differential read-out circuit, by way of example, the movement $14''_1$ that is carried out at the same time as the movement $14''_2$ can be ascertained in the measurement signal 28, since the capacitive changes between the movable electrode $14_1$ and the stator electrode 16 and between the movable electrode $14_2$ and the stator electrode 16 are added. This is represented by the capacitance $C_1$ which makes it possible for a change in the distance between the movable electrode $14_1$ and the stator electrode 16 to bring about a voltage change at the measurement signal 28. The common-mode read-out circuit 22 can be configured to detect, by means of the measurement signal 28, a first capacitance value correlated therewith between the movable electrode $14_1$ and the stator electrode 16 and a second capacitance value between the movable electrode $14_2$ and the stator electrode.

The MEMS sensor 10 can thus be used even in varying ambient conditions where for example external pressures or temperature changes have the effect that the movable electrodes $14_1$ and $14_2$ simultaneously move toward or move away from the stator electrode 16, which would be difficult or not possible to ascertain with a differential read-out circuit.

FIG. 1b shows a schematic lateral sectional view of a MEMS sensor 10' in accordance with one exemplary embodiment, which is constructed similarly to the MEMS sensor 10 and comprises a second movable electrode $14_2$. The movable electrode $14_1$ can correspond to the movable electrode 14 from FIG. 1a. The movable electrode $14_2$ can be implemented identically to the movable electrode $14_1$ and be arranged such that the movable electrode $14_1$ is arranged opposite the movable electrode $14_2$ and the stator electrode 16 is arranged between the movable electrodes $14_1$ and $14_2$.

The movable electrodes $14_1$ and $14_2$ can both be deflectable along the direction z in each case in a positive and/or negative direction of same. By way of example, the movable electrodes $14_1$ and $14_2$ can move at least approximately identically or synchronously, for instance simultaneously carry out the movement $14'_1$ and $14''_2$ or $14''_1$ and $14'_2$ or move toward one another or move away from one another. A movement or deflection of the movable electrodes $14_1$ and/or $14_2$ is indicated by dashed lines in accordance with FIG. 1a, said dashed lines being provided with the reference signs $14'_1$ and $14'_2$ respectively. In this case, $14'_1$ and $14'_2$ can denote a movement of the respective movable electrode $14_1$ and $14_2$ away from the stator electrode 16, while the designations $14''_1$ and $14''_2$ can denote a movement toward the stator electrode 16.

In accordance with one exemplary embodiment, the movable electrodes $14_1$ and $14_2$ can be mechanically connected to one another through a plane of the stator electrode 16 and be configured to carry out a simultaneous movement. For this purpose, the stator electrode 16 can have openings or cutouts through which project supporting elements that connect the movable electrodes $14_1$ and $14_2$ to one another.

The movable electrodes $14_1$ and/or $14_2$ can likewise be connectable to one potential and/or be individually or jointly connectable to another potential, which can be identical between the movable electrodes $14_1$ and $14_2$ or can be different from one another. In this regard, the connection to the reference potential can also be effected individually or jointly, that is to say that the movable electrodes $14_1$ and $14_2$ can have a common or a mutually different potential. The movable electrodes $14_1$ and $14_2$ can be connectable to a reference potential or have the latter, for example, in order to have a low sensitivity to interference vis-à-vis external components if the latter come into contact with the movable electrodes or reach the vicinity thereof.

As has been described for the movable electrode 14 in FIG. 1a, with regard to the movable electrode $14_2$, too, a capacitance $C_2$ between the movable electrode $14_2$ and the stator electrode 16 can take effect, such that the measurement signal 28 provided by the common-mode read-out circuit can indicate information regarding a movement of the movable electrodes $14_1$ and/or $14_2$ relative to the stator electrode 16. Each of the individual movements of the movable electrodes $14_1$ and $14_2$ can make a contribution to the measurement signal 28.

In other words, by means of an arrangement that pulls both membranes to the same potential and they can therefore be referred to as short-circuited membranes and with the MEMS substrate as well they have the same potential, for instance GND, what can be achieved is that it is robust on both sides of the MEMS, in particular for the front and back volume. A MEMS of this type can be fabricated in a simple manner since insulation between the two movable membranes can be dispensed with. A read-out circuit in accordance with the exemplary embodiments described can be used for the short-circuited membranes. In the configuration illustrated, the electrical signal obtained by the displacement of the upper membrane $14_1$ can be inversely proportional to the signal generated by the lower membrane $14_2$, such that the acoustic signal is compensated for or extinguished or is at least damped. The embodiment in accordance with FIG. 2 enables a robust topology in which acoustic signals can be damped or extinguished, such that a high efficiency as a pressure sensor is possible. In particular, a use as an ambient pressure sensor is possible.

FIG. 2 shows a schematic block diagram of a MEMS sensor 20 in accordance with one exemplary embodiment. The movable electrodes $14_1$ and $14_2$ of the MEMS arrangement 12 can be connected to a reference potential $U_{ref}$, for example 0 volts or ground (GND) or some other potential. Alternatively or additionally, the substrate 17 can be connected to the reference potential $U_{ref}$. The connecting/connection of the movable membranes $14_1$ and/or $14_2$ and/or the connecting of the substrate 17 to the reference potential $U_{ref}$ can enable a high insensitivity of the MEMS arrangement 12 vis-à-vis leakage currents if for example contaminants or particles come into contact with the respective components and/or produce an electrical or mechanical connection to other conductive parts. The stator electrode 16 can be electrically insulated from the substrate 17, for instance by using an insulation layer or the like. This makes it possible to reduce or even avoid leakage currents or the like between the stator electrode 16 and the substrate 17. One possible cause of such leakage currents may be e.g. conductive particles that penetrate into the MEMS sensor. A distance between the movable electrodes $14_1$ and $14_2$ and the stator electrode can be for example at least 0.5 μm and at most 10 μm, at least 1 μm and at most 5 μm or at least 1.5

μm and at most 4 μm, for instance 2 μm. Particles of corresponding size can produce a mechanical and possibly electrical connection.

Although the substrate 17 is illustrated such that it is at the common reference potential $U_{ref}$ with the movable electrodes 14$_1$ and 14$_2$, alternatively mutually different potentials can also be able to be applied. At least one of the movable electrodes 14$_1$ and 14$_2$ can be electrically insulated from an environment of the substrate 17.

A filter arrangement 32 can be arranged between the bias voltage source 18 and the stator electrode 16, said filter arrangement being configured to filter the voltage $U_1$ provided by the bias voltage source 18 with respect to the stator electrode 16 and also a voltage change at the stator electrode 16 as a result of a movement of the movable electrodes 14$_1$ and/or 14$_2$ with respect to the bias voltage source 18. By way of example, the filter 32 can be formed as a low-pass filter and have an ohmic resistance $R_1$ and an electrical capacitance $C_3$. Further ohmic resistances can be arranged between the filter 32 and the MEMS arrangement 12, as is illustrated by $R_2$. By way of example line resistances and/or resistance elements can be involved here.

The common-mode read-out circuit 22 can likewise have ohmic resistances, as is indicated by $R_3$. In a manner comparable with $R_2$ line resistances and/or ohmic resistance elements can be involved here. Furthermore, the common-mode read-out circuit 22 can have an amplifier element 34, which can be configured to amplify the signal obtained from the capacitive coupling 24 and the bias voltage source 26, in order to provide the measurement signal 28. The amplifier element 34 can be for example an operational amplifier. Alternatively, it is likewise possible to arrange other or further amplifier elements, for instance tube amplifiers or the like.

As is already evident in FIG. 1, the bias voltage source 18 can be configured to provide the MEMS arrangement 12 with a bias voltage, and so the voltage $U_1$ can also be referred to as a MEMS bias voltage (MEMS Bias). Alternatively or additionally, the bias voltage source 26 can be configured to supply the common-mode read-out circuit with a bias voltage, the voltage $U_2$. The common-mode read-out circuit 22 can be part of a control circuit for controlling and/or evaluating the MEMS sensor 20. A control circuit of this type can be formed for example as an application specific integrated circuit (ASIC), and so the voltage $U_2$ can be an ASIC bias voltage (ASIC Bias). The MEMS or the MEMS arrangement 12 and the ASIC can be operated with different voltage levels or potential values. The arrangement of two bias voltage sources 18 and 26 that are controllable separately from one another makes it possible to supply the MEMS arrangement 12 and the common-mode read-out circuit 22 with voltages respectively suitable therefor. The bias voltage source 18 can be configured to apply the voltage $U_1$ such that the latter has a potential of at least 3 volts; in accordance with one exemplary embodiment, the potential $U_1$ comprises a value of at least 3 volts and at most 15 volts, at least 4 volts and at most 13 volts or at least 5 volts and at most 10 volts. In contrast thereto, the voltage $U_2$ or the assigned potential can have a value of at most 2.5 volts. In accordance with one exemplary embodiment, a value of the voltage $U_2$ is a value of at least 0 volts and at most 2.5 volts, of at least 0.1 volt and at most 1.5 volts, or of at least 0.2 volt and at most 1 volt. In accordance with one exemplary embodiment, the voltages $U_1$ and $U_2$ can be DC voltages.

Although the movable electrodes 14$_1$ and 14$_2$ are illustrated such that they are connected to the reference potential $U_{ref}$, the electrodes can also be connected to some other common potential. The stator electrode 16 is connected to a potential that is different therefrom.

Figure 3:
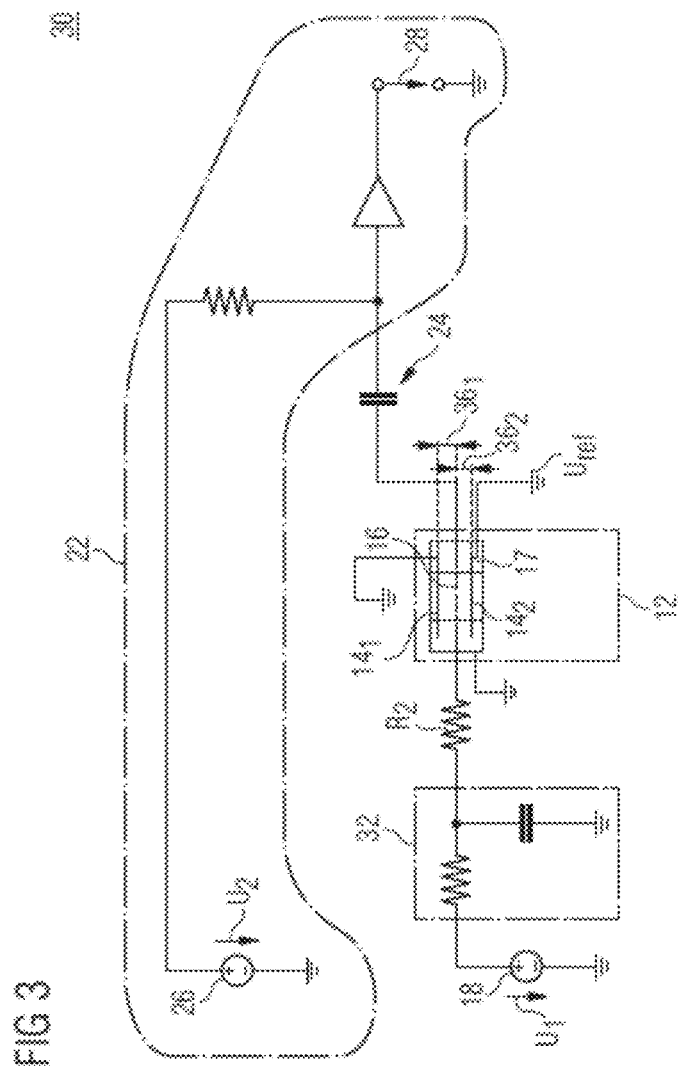
FIG. 3 shows a schematic block diagram of a MEMS sensor in accordance with one exemplary embodiment, wherein the movable electrodes are at mutually different distances with respect to a stator electrode.

FIG. 3 shows a schematic block diagram of a MEMS sensor 30 in accordance with one exemplary embodiment, wherein the movable electrodes 14$_1$ and 14$_2$ are at mutually different distances 36$_1$ and 36$_2$, respectively, with respect to the stator electrode 16. The distance 36$_2$ can lie in the ranges mentioned in association with FIG. 2 and be 2 μm, for example. By contrast, the distance 36$_1$, increased here in comparison can be a value of at least 2 μm and at most 20 μm, at least 3 μm and at most 15 μm, at least 5 μm and at most 12 μm, approximately 10 μm. Although the distances 36$_1$ and 36$_2$ have been described such that the distance 36$_1$ is greater than the distance 36$_2$, alternatively the distance 36$_2$ can also be greater than the distance 36$_1$.

The movable membranes 14$_1$ and 14$_2$ have a common reference potential $U_{ref}$, such that an identical movement amplitude in the movable electrodes 14$_1$ and 14$_2$ on the basis of the mutually different distances 36$_1$ and 36$_2$ with respect to the stator electrode 16 brings about different effects in the changes of the capacitance values between the respective movable electrode 14$_1$ and 14$_2$ and the stator electrode 16. This enables a superposition of different value ranges of voltage changes in the measurement signal 28, which are identifiable and evaluable by a corresponding read-out or evaluation circuit. That is to say that the compensation of the movements of the movable electrodes 14$_1$ and 14$_2$, for instance in association with the use as a microphone, can be reduced or cancelled by setting a deliberately mutually different distance between the movable electrodes 14$_1$ and 14$_2$ with respect to the stator electrode 36. A quotient of the distances 36$_1$ and 36$_2$ can have a value that is at least 1.1. Alternatively, it is likewise possible to choose the distances 36$_1$ and 36$_2$ such that the value is at least 2, at least 5 or at least 10, wherein this can be done under the assumption that the larger distance is in the numerator of a fraction and the smaller distance is in the denominator of a fraction.

The aspect of the different distances 36$_1$ and 36$_2$ can also be implemented independently of the connecting of the MEMS sensor to the common-mode read-out circuit 22. That is to say that one exemplary embodiment can relate to a MEMS sensor comprising the MEMS arrangement 12, that is to say the movable electrodes 14$_1$ and 14$_2$ between which the stator electrode 16 is arranged, wherein the movable electrode 14$_1$ in a rest state, that is to say in an undeflected state or state not subjected to pressures or voltages, is arranged at the distance 36$_1$ from the stator electrode 16 and the movable electrode 14$_2$ in the rest state is arranged at the distance 36$_2$ from the stator electrode, wherein the distances 36$_1$ and 36$_2$ are different from one another as described.

Figure 4:
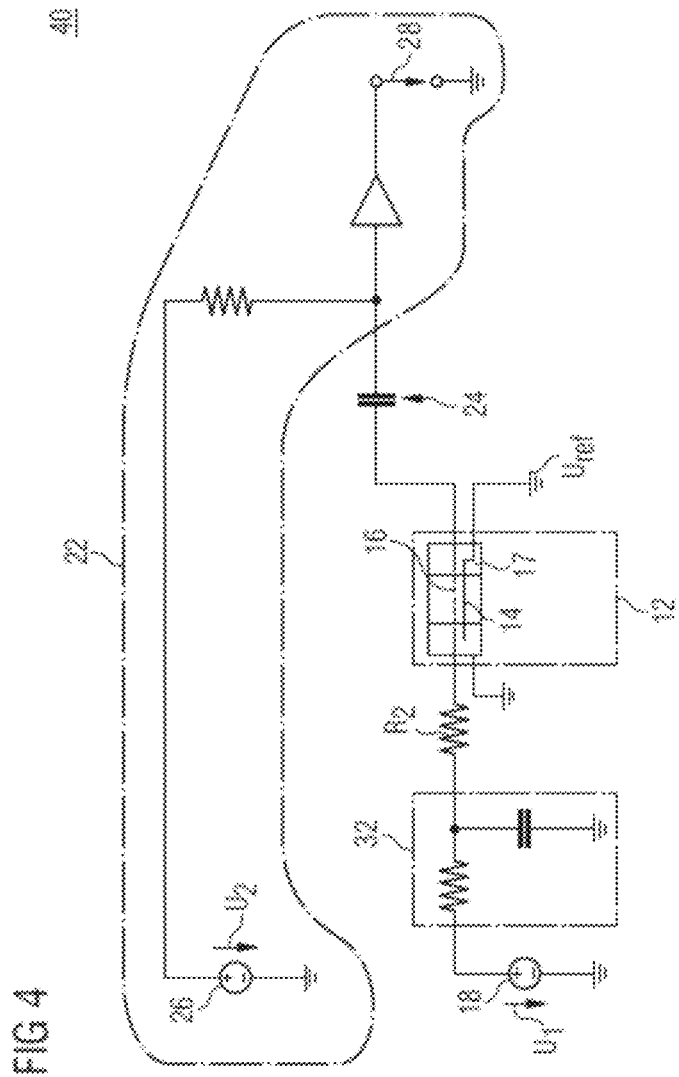
FIG. 4 shows a schematic block diagram of a MEMS sensor in accordance with one exemplary embodiment, wherein only one of the movable membranes is arranged compared with the MEMS sensor from FIG. 3.

FIG. 4 shows a schematic block diagram of a MEMS sensor 40, wherein any one of the movable membranes is arranged compared with the MEMS sensor 30, that is to say that an absence of the second movable membrane can be implemented. The common-mode read-out circuit 22 can obtain, without restrictions, the measurement signal 28 on the basis of a movement of the deflectable membrane 14.

The MEMS sensor 40 can be understood as an extreme case of the MEMS sensor 30, wherein the distance 36$_1$ is infinite, for example. However, such an assumption can also already be made if the quotient described in association with FIG. 3 exceeds a value of 10, that is to say that the distance 36$_1$ is greater than the distance 36$_2$ by a factor of at least 10, such than influence of the capacitance that takes effect between the deflectable membrane 14$_1$ and the stator electrode 16 become small to negligible. This can be regarded as though one of the electrodes were absent, which is in accordance with the exemplary embodiment in accordance with FIG. 1a.

In other words, for obtaining a sensitivity vis-à-vis sound waves and for operating the MEMS sensor 30 or 40 as a microphone, it is possible to implement an asymmetry in the MEMS sensor, such that distances between the movable electrodes and the stator electrode are different from one another by design, that is to say intentionally, and/or one of the movable electrodes is absent. Signals having a varying amplitude can be obtained as a result of the mechanical asymmetry obtained. As a result, the effect of mutual extinction can be reduced or prevented. A dominant proportion of the signals can originate from the movable electrode $14_2$, for example, since the nearer capacitor carries more charges. The signal proportion thereof can be reduced by the signal of the capacitor having the smaller amount of charge carriers, i.e. of the movable membrane $14_1$.

Figure 5:
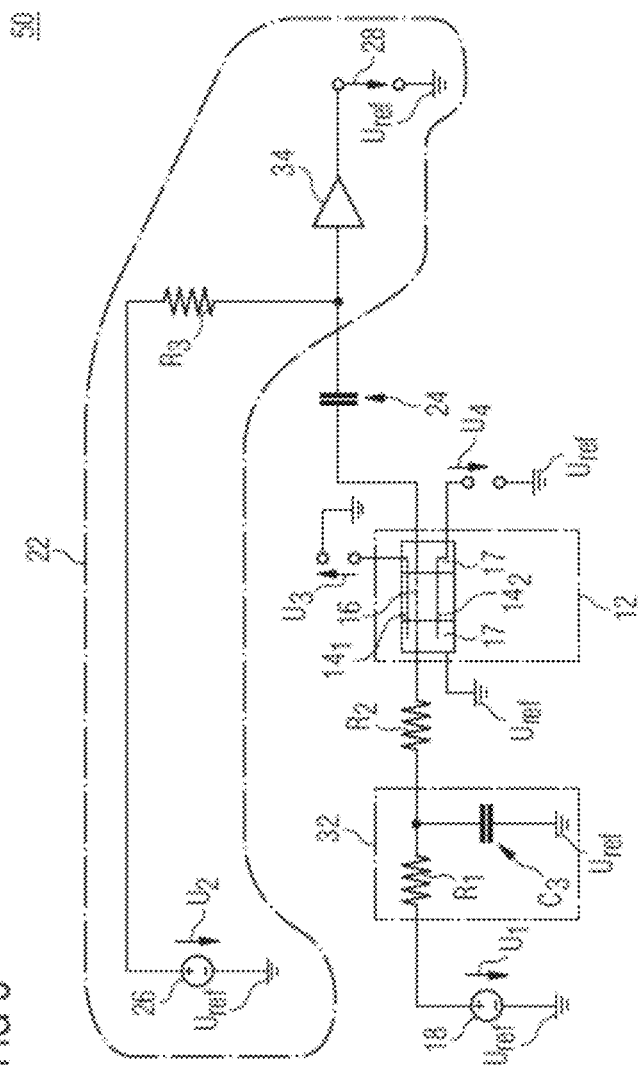
FIG. 5 shows a schematic block diagram of a MEMS sensor in accordance with one exemplary embodiment, wherein the movable electrodes are connectable to mutually different potentials compared with the MEMS sensor from FIG. 2.

FIG. 5 shows a schematic block diagram of a MEMS sensor 50 in accordance with one exemplary embodiment, wherein the movable electrodes $14_1$ and $14_2$ are connectable to mutually different potentials compared with the MEMS sensor 20. In this regard, the movable electrode $14_1$ can be raised via a voltage $U_3$ with a first potential and the movable electrode $14_2$ can be raised with a voltage $U_4$ to a second potential. The potentials as a result of the voltages $U_3$ and $U_4$ can be different than the reference potential $U_{ref}$. The movable electrodes $14_1$ and $14_2$ can be electrically insulated from the substrate, wherein the substrate 17 can electrically be connected to the reference potential $U_{ref}$.

The voltages $U_3$ and $U_4$ can both make it possible in each case to obtain a potential that is different than the reference potential $U_{ref}$, that is to say that the voltages $U_3$ and $U_4$ can be different than ZERO. Alternatively, it is likewise possible for one of the voltages $U_3$ or $U_4$ to have a value of ZERO, such that the corresponding movable electrode $14_1$ or $14_2$ is electrically connected to the reference potential and has the potential thereof. If both voltages $U_3$ and $U_4$ are set to ZERO, then the configuration in accordance with the MEMS sensor 20 can be obtained. In this case, it is also possible to dispense with an insulation of the movable electrodes $14_1$ and $14_2$.

If at least one of the voltages $U_3$ or $U_4$ is different than ZERO and if the voltages $U_3$ and $U_4$ are different from one another, then a mutually different distance between the movable electrode $14_1$ and the stator electrode 16 and between the movable electrode $14_2$ and the stator electrode 16 can be compensated for. By way of example, this can involve manufacturing tolerances that lead to a possibly unintentionally mutually different distance. In the case of a mutually different distance, an identical potential at the movable electrodes $14_1$ and $14_2$ can lead to mutually different amplitudes in the excursion of the measurement signal 28, which can be balanced or compensated for by adapting the voltages $U_3$ and $U_4$ proportionally to their mutually different distances. That is to say that applying different potentials to the electrodes $14_1$ and $14_2$ enables a high robustness of MEMS sensors.

It is pointed out at this juncture that setting different potentials at different movable electrodes $14_1$ and $14_2$ can for example also be applied in the configuration in accordance with FIG. 1b and/or the configuration in accordance with FIG. 3, for instance in order to obtain effects similar to those made possible by the mechanical asymmetry in accordance with FIG. 3 by means of an electrical asymmetry. That is to say that mutually different voltages $U_3$ and $U_4$ can enable different sensitivities of a respective movement of the respective movable electrodes $14_1$ and $14_2$.

Figure 6:
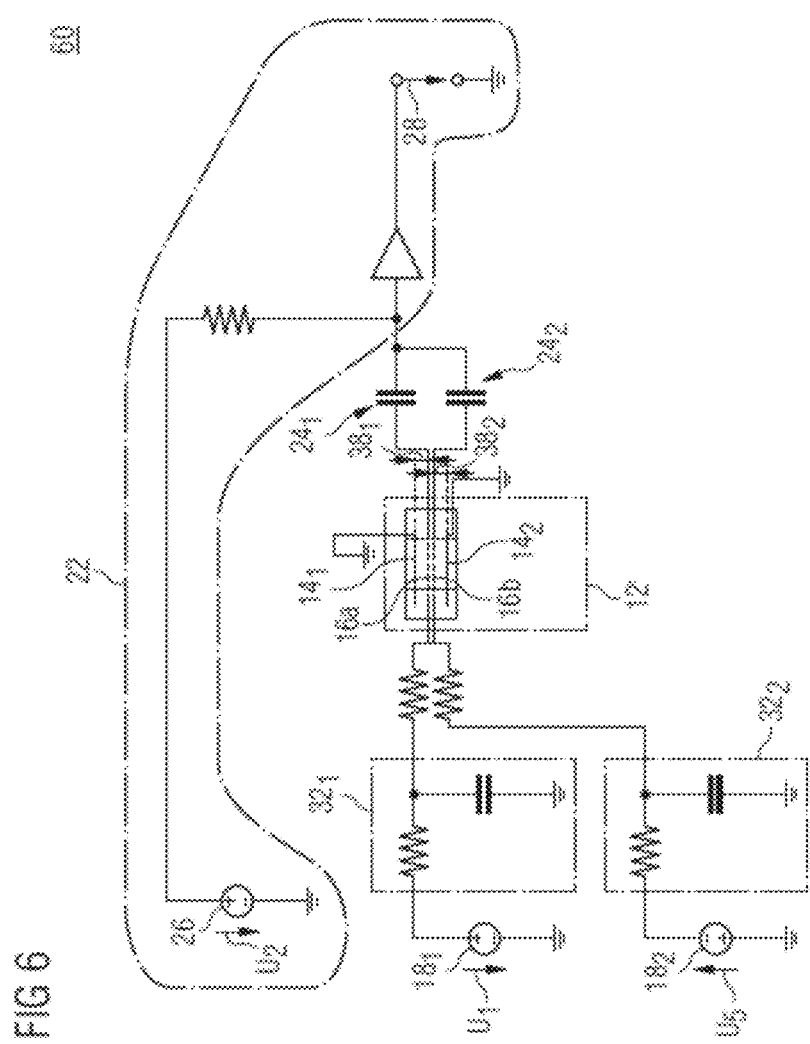
FIG. 6 shows a schematic block diagram of a MEMS sensor in accordance with one exemplary embodiment, wherein the stator electrode has a first stator electrode element and a second stator electrode element.

FIG. 6 shows a schematic block diagram of a MEMS sensor 60 in accordance with one exemplary embodiment, wherein the stator electrode has a first stator electrode element 16a and a second stator electrode element 16b. The first stator electrode element 16a is arranged in a manner facing the movable electrode $14_1$. The stator electrode element 10 is arranged opposite the stator electrode element 16a and is arranged in a manner facing the movable electrode $14_2$. The MEMS sensor 60 is configured to apply a mutually different potential to the first stator electrode element 16a and the second stator electrode element 16b. For this purpose, the MEMS sensor 60 can comprise a bias voltage source $18_1$ which can correspond for example to the bias voltage source 18 from FIG. 1. The bias voltage source $18_1$ can be configured to apply the potential $U_1$ to the stator electrode element 16a. In addition, the MEMS sensor 60 can comprise a bias voltage source $18_2$ configured to apply a corresponding potential to the stator electrode element 16b on the basis of a voltage $U_5$. The voltage $U_5$ can be equal to the voltage $U_1$ in terms of absolute value within a tolerance range of ±50%, ±20%, ±10% or ±5% and can have for example a polarity different therefrom. That is to say that the potentials obtained on the basis of the voltages $U_1$ and $U_2$ can have mutually different signs relative to the reference potential $U_{ref}$.

The stator electrode elements 16a and 16b can also be understood as a double embodiment of the stator electrode, wherein in each case one of the stator electrode elements 16a and 16b is formed for capacitive coupling to one of the movable electrodes $14_1$ or $14_2$ respectively. High measurement sensitivity can likewise be obtained as a result of the mutually different potentials. Each of the stator electrode elements 16a or 16b can be connected to the common bias voltage source 26 via a capacitive coupling $24_1$ or $24_2$, respectively.

As an alternative to the voltage $U_5$ being embodied such that it is equal to the voltage $U_1$, in terms of absolute value, which can lead to potentials at the stator electrode elements 16a and 16b that are equal in terms of absolute value but have inverted signs, it is also possible to apply potentials $U_1$ and $U_5$ having identical signs and/or potentials $U_1$ and $U_5$ that are equal in terms of absolute value. If the potentials $U_1$ and $U_5$ are identical both in terms of sign and in terms of absolute value, then the MEMS sensor 60 can behave for example as described in association with FIG. 2.

As a result of the embodiment of the stator electrode in the form of the stator electrode elements 16a and 16b the MEMS sensor 60 can be configured to detect a first movement of the movable electrode $14_1$ relative to the stator electrode element 16a and a movement of the movable electrode $14_2$ relative to the stator electrode element $14_2$. These can be for example two components configured substantially independently of one another in the measurement signal 28. In this regard, by way of example, an external pressure that acts only on one of the two movable electrodes $14_1$ or $14_2$ can be identified in the measurement signal 28.

Furthermore, the mutually separately generatable and/or settable voltages $U_1$ and $U_2$ enable a compensation of production tolerances with the reference potential being simultaneously applied to the movable electrodes. Intentionally or unintentionally, that is to say on the basis of manufacturing tolerances, distances $38_1$ between the control electrode element 16a and the movable electrode $14_1$ and $38_2$ between the control electrode element 16b and the movable electrode $14_2$ can be different from one another. The MEMS sensor 60 can be configured such that a ratio of the distance $38_1$ and the distance $38_2$ corresponds to a ratio in terms of absolute value between the voltages $U_3$ and $U_5$, or the potentials obtained therefrom, within a tolerance range of ±33%, ±20% or ±15%. This applies in particular voltages $U_2$ and $U_5$ having inverted signs, in the case of which the absolute value of the respective voltages should be taken into consideration.

The configuration in accordance with FIG. 6 enables robust read-out with a dual stator electrode. An outer face or outer surface of the MEMS sensor can largely or completely be connected to the reference potential, that is to say be embodied in a shielded manner.

In other words, FIG. 6 shows a further configuration of a robust read-out circuit. The back plate, that is to say the stator, is embodied with two electrodes insulated from one another. Each of the stator electrodes 16a and 16b is biased with a DC voltage that is independent of one another. One DC voltage, for instance the voltage $U_1$, can have a positive sign, such that a positive voltage is obtained. The other voltage, for instance the voltage $U_5$, can be a negative voltage having a negative sign. The movable electrodes $14_1$ and $14_2$ and/or the substrate 17 can have applied thereto an average bias voltage, for instance ground, if one voltage is positive and the other is negative, or a geometric mean of the voltages $U_1$ and $U_5$. The embodiment in FIG. 6 can also be referred to as a single-ended read-out circuit.

FIG. 7 shows a schematic lateral sectional view of a MEMS sensor 70 in accordance with one exemplary embodiment, which is embodied for example as a so-called "top port" microphone (microphone with sound opening arranged at the top). Although the MEMS sensor 70 is illustrated such it comprises two movable electrodes $14_1$ and $14_2$, it is also possible for just one of the movable electrodes to be arranged. The stator electrode 16 can be embodied in a perforated fashion, that is to say have holes, such that a displacement of fluid arranged between the movable electrodes $14_1$ and $14_2$ is possible with only little resistance. The MEMS sensor 70 can comprise an ASIC 42, which can comprise at least the functionality of the common-mode read-out circuit 22. The ASIC 42 can furthermore provide the functionality of the bias voltage source 18. The substrate 17 can be mechanically connected to a printed circuit board (PCB) or be arranged thereon. The ASIC 42 can be arranged adjacent thereto and be connected via an electrical connection 46 to at least one of the movable electrodes $14_1$ and/or $14_2$ and/or the stator electrode 16.

The arrangement can be enclosed for the most part by a housing 48, wherein an opening 52 enables an exchange and/or entry of fluid into the interior of the housing 48, such that fluid sound and/or pressure can be detected by the MEMS sensor 70.

In other words, the read-out circuits in accordance with FIGS. 1 to 6 can be applied in top port microphones. In this case, the circuit can be modified such that the membranes $14_1$ and $14_2$ are connected.

FIG. 8 shows a schematic lateral sectional view of a MEMS sensor 80 in accordance with one exemplary embodiment, which is embodied as a bottom port microphone (opening arranged at the bottom) compared with the MEMS sensor 70 from FIG. 7. By way of example, the opening 52 can be arranged in the substrate and make it possible for the sound and/or pressure to pass through a plane of the printed circuit board 44 to at least the movable electrode $14_2$. The housing 48 can furthermore have an optional ventilation opening 54, which can for example also be arranged in the printed circuit board 44 of the MEMS sensor 70 and makes it possible that varying pressures, for instance as a result of temperature gradients, can be compensated for by an exchange of fluid.

In exemplary embodiments, the read-out circuit can be combined with a MEMS design which is realized in the absence of ventilation openings. This makes it possible to reduce or prevent a contamination that may enter the back volume. Instead of this, the ventilation can be realized by means of a small opening in the housing cover 48. This makes it possible for only the sound port, i.e. the opening 52, to be exposed to the environmental condition.

FIG. 9 shows a schematic lateral sectional view of a MEMS sensor 90 in accordance with one exemplary embodiment, wherein unlike in FIGS. 7 and 8, where the electrical connection 46 can possibly be embodied in a self-supporting fashion, the electrical connection 46 is implemented within the printed circuit board 44 or as a conductor track thereon, which can be referred to as a flip-chip arrangement (flip-chip assembly). That is to say that a side of the ASIC 42 that faces the ventilation opening 54 in FIG. 8 can be arranged in a manner facing the printed circuit board 44 in the embodiment in FIG. 9.

The movable electrodes $14_1$ and $14_2$ can have openings just like the stator electrode 16, for instance in order to implement a functionality of a ventilation opening. This can result for example in a fluid penetrating into a back volume 56 with a certain pressure of, for instance, more than 1.5 bar, more than 2 bar, more than 3 bar or more than 5 bar, through the electrodes $14_1$ and $14_2$. This can involve for example water or the like. The exemplary embodiments described herein make it possible for such pressures to be detected and for presence of such a fluid in the back volume 56 to result in no or at most a slight influencing of the measurement accuracy of the MEMS sensor. The ventilation opening 54 can optionally be arranged.

Immobile components, for instance the ASIC 42, can be enclosed by a possibly electrically insulating material that reduces or prevents contact with the corresponding component and a fluid arranged in the back volume 56. This can involve for example an adhesive, a resin or a plastic. The material 58 can be used as GEOTOP (referred to as: globtop). Alternatively or additionally, parts of the substrate 17 can also be covered with the material 58.

In other words, the MEMS and/or the ASIC can be embodied using flip-chip techniques. An underfill can be arranged between the respective components, i.e. the substrate 17 and/or the ASIC 42 and the printed circuit board 44. This makes it possible to protect the MEMS-ASIC interface further.

The exemplary embodiments described herein enable a high performance of MEMS sensors, in particular MEMS microphones, if they come into contact with particles, vapor or fluidic contaminations. In this regard, by way of example, the connection of the movable membranes 14, $14_1$ and/or $14_2$ makes it possible to reduce or prevent leakage currents.

Some of the exemplary embodiments described herein comprise a MEMS having a dual membrane and a special, unconventional read-out component, or a read-out architecture, which make the MEMS sensor robust. The dual membrane, that is to say the presence of the movable electrodes $14_1$ and $14_2$, can reduce or prevent a mechanical contamination, for instance a blockage. The read-out circuits described enable a high robustness vis-à-vis electrical leakage currents.

Figure 10:
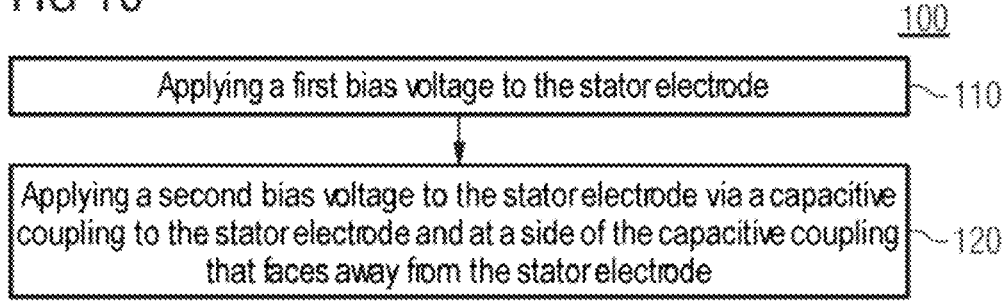
FIG. 10 shows a schematic flow diagram of a method for controlling a MEMS sensor in accordance with one exemplary embodiment.

FIG. 10 shows a schematic flow diagram of a method 100 for controlling a MEMS sensor in accordance with one exemplary embodiment. The controlled MEMS sensor can be an arbitrary MEMS sensor in accordance with one exemplary embodiment, for instance the MEMS sensor 10, 10', 20, 30, 40, 50, 60, 70, 80 and/or 90. A step 110 comprises applying a first bias voltage to the stator electrode of the MEMS sensor, for instance the stator electrode 16. A step 120 comprises applying a second bias voltage to the stator electrode via a capacitive coupling to the stator electrode and at a side of the capacitive coupling that faces away from the stator electrode.

Figure 11:
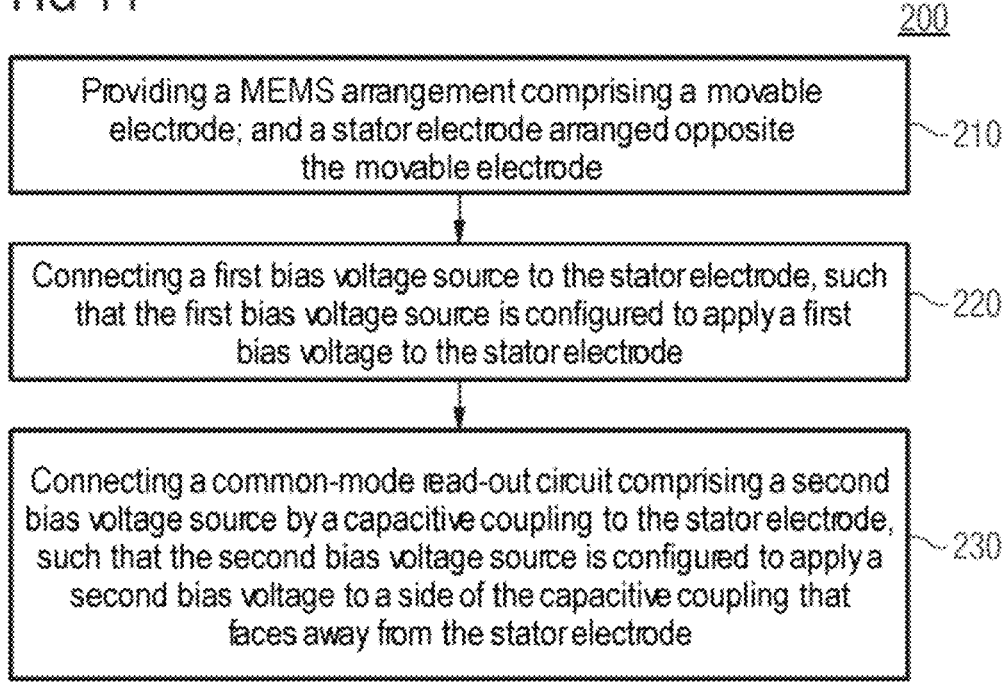
FIG. 11 shows a schematic flow diagram of a method for providing a MEMS sensor in accordance with one exemplary embodiment.

FIG. 11 shows a schematic flow diagram of a method 200 for providing a MEMS sensor in accordance with one exemplary embodiment, for instance the MEMS sensor 10, 10', 20, 30, 40, 50, 60, 70, 80 and/or 90. A step 210 comprises providing a MEMS arrangement comprising a movable electrode and a stator electrode arranged opposite the movable electrode. A step 220 comprises connecting a first bias voltage source to the stator electrode, such that the first bias voltage source is configured to apply a first bias voltage to the stator electrode. A step 230 comprises connecting a common-mode read-out circuit comprising a second bias voltage source by a capacitive coupling to the stator electrode, such that the second bias voltage source is configured to apply a second bias voltage to a side of the capacitive coupling that faces away from the stator electrode.

Figure 12:
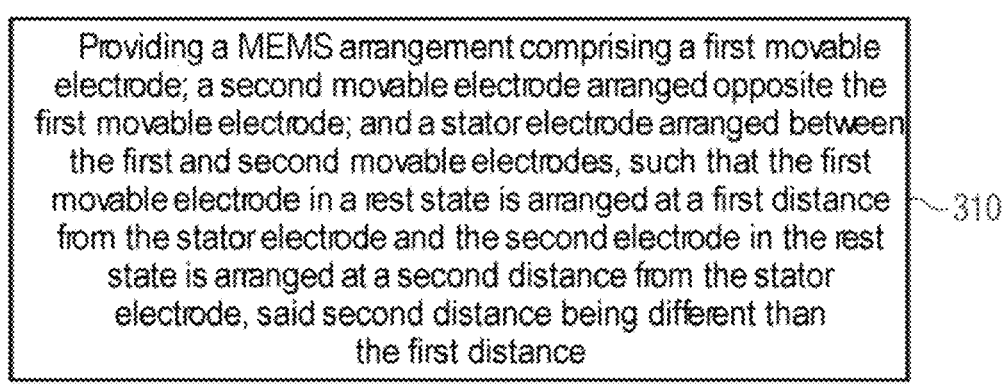
FIG. 12 shows a schematic flow diagram of a further method for providing a MEMS sensor in accordance with one exemplary embodiment.

FIG. 12 shows a schematic flow diagram of a method 300 for providing a MEMS sensor in accordance with one exemplary embodiment, for instance the MEMS sensor 30. The method 300 comprises a step 310 involving providing a MEMS arrangement comprising a first movable electrode, a second movable electrode arranged opposite the first movable electrode, and a stator electrode arranged between the first and second movable electrodes. The providing is carried out such that the first movable electrode in a rest state is arranged at a first distance from the stator electrode and the second electrode in the rest state is arranged at a second distance from the stator electrode, said second distance being different than the first distance.

Exemplary embodiments describe MEMS sensors in which different potentials are applied to different movable electrodes, for instance in association with FIG. 5. Other exemplary embodiments describe embodiments in which different movable electrodes are at different distances from the stator electrode, for instance in association with FIG. 3. Other embodiments relate to MEMS sensors in which the stator electrode is embodied doubly or has two stator electrode elements, for instance in association with FIG. 6. Although these embodiments have been explained in association with different MEMS sensors, the aspects mentioned can be arbitrarily combined with one another or implemented individually.

Additional exemplary embodiments and aspects of the invention are described which can be used individually or in combination with the features and functionalities described herein.

In accordance with a first aspect, a MEMS sensor 10;10'; 20; 30; 40; 50; 60; 70; 80; 90 can have the following features: a MEMS arrangement 12; 12' comprising: a movable electrode 14; $14_1$, $14_2$, a stator electrode 16, arranged opposite the movable electrode 14; $14_1$, $14_2$; a first bias voltage source 18; $18_1$, $18_2$, which is connected to the stator electrode 16; 16a, 16b and which is configured to apply a first bias voltage $V_1$, $V_5$ to the stator electrode 16; 16a, 16b; and a common-mode read-out circuit 22 connected to the stator electrode 16; 16a, 16b by a capacitive coupling 24 and comprising a second bias voltage source 26, which is configured to apply a second bias voltage $U_2$ to a side of the capacitive coupling 24 that faces away from the stator electrode 16; 16a, 16b.

In accordance with a second aspect referring to the first aspect, in the MEMS sensor the movable electrode can be a first movable electrode $14_1$, and said MEMS sensor can furthermore comprise a second movable electrode $14_2$, which is arranged opposite the first movable electrode $14_1$, wherein the stator electrode 16; 16a, 16b is arranged between the first and second movable electrodes $14_1$, $14_2$.

According to a third aspect referring to the second aspect, in the MEMS sensor the first and second movable electrodes $14_1$, $14_2$ can be configured to be connected to a common first potential $U_{ref}$, and wherein the stator electrode 16; 16a, 16b is configured to be connected to a second potential $U_1$ which is different than the first potential.

In accordance with a fourth aspect referring to the third aspect, in the MEMS sensor the first potential $U_{ref}$ can be a reference potential of the MEMS sensor.

In accordance with a fifth aspect referring to the second aspect, in the MEMS sensor the first and second movable electrodes $14_1$, $14_2$ can be movable along the same direction z.

In accordance with a sixth aspect referring to the second aspect, in the MEMS sensor the first and second movable electrodes $14_1$, $14_2$ can be mechanically connected to one another through a plane of the stator electrode 16; 16a, 16b, and configured to carry out a simultaneous movement.

In accordance with a seventh aspect referring to the second aspect, in the MEMS sensor the common-mode read-out circuit 22 can be configured to detect a first capacitance value $C_1$ between the first movable electrode $14_1$ and the stator electrode 16; 16a, 16b and a second capacitance value $C_2$ between the second movable electrode $14_2$ and the stator electrode 16; 16a, 16b.

In accordance with an eighth aspect referring to the first aspect, in the MEMS sensor at least one of the movable electrode 14; $14_1$, $14_2$ and of the stator electrode 16; 16a, 16b can be held by a substrate 17 configured to be connected to a reference potential $U_{ref}$ of the MEMS sensor.

In accordance with a ninth aspect referring to the first aspect, in the MEMS sensor at least one of the movable electrode 14; $14_1$, $14_2$ and of the stator electrode 16; 16a, 16b can be held by a substrate 17, wherein the substrate is electrically insulated from the movable electrode 14; $14_1$, $14_2$ and an environment of the substrate 17.

In accordance with a tenth aspect referring to the first aspect, in the MEMS sensor the first bias voltage source 18; $18_1$, $18_2$ can be configured to apply the first bias voltage $U_1$, $U_5$ with a potential of at least 3 V, and the second bias voltage source 26 can be configured to apply the second bias voltage $U_2$ with at most 2.5 V.

In accordance with an eleventh aspect referring to the first aspect, in the MEMS sensor the first bias voltage $U_1$, $U_5$ and the second bias voltage $U_2$ can be DC voltages.

In accordance with a twelfth aspect referring to the first aspect, in the MEMS sensor the movable electrode can be a first movable electrode $14_1$, and said MEMS sensor furthermore can comprise a second movable electrode $14_2$, which is arranged opposite the first movable electrode $14_1$, wherein the stator electrode 16; 16a, 16b is arranged between the first and second movable electrodes $14_1$, $14_2$; wherein the first movable electrode $14_1$ in a rest state is arranged at a first distance $36_1$ from the stator electrode 16; 16a, 16b and the second movable electrode $14_2$ in the rest state is arranged at a second distance $36_2$ from the stator electrode 16; 16a, 16b, said second distance being different than the first distance $36_1$.

In accordance with a thirteenth aspect referring to the eleventh aspect, in the MEMS sensor a quotient of the first and second distances $36_1$, $36_2$ can have a value of at least 1.1.

According to a fourteenth aspect referring to the first aspect, in the MEMS sensor the movable electrode can be a first movable electrode $14_1$, and said MEMS sensor furthermore can comprise a second movable electrode $14_2$, which is arranged opposite the first movable electrode $14_1$, wherein the stator electrode 16; 16a, 16b is arranged between the first and second movable electrodes $14_1$, $14_2$; wherein the stator electrode has a first stator electrode element 16a which is arranged in a manner facing the first movable electrode $14_1$ and an opposite second stator electrode element 16b which is arranged in a manner facing the second movable electrode $14_2$, wherein the MEMS sensor is configured to apply a mutually different potential $U_1$, $U_5$ to the first stator electrode element 16a and the second stator electrode element 16b.

In accordance with a fifteenth aspect referring to the fourteenth aspect, the MEMS sensor can be configured to detect a first movement of the first movable electrode $14_1$ relative to the first stator electrode element 16a and a second movement of the second movable electrode $14_2$ relative to the second stator electrode element 16b.

In accordance with a sixteenth aspect referring to the fourteenth aspect, in the MEMS sensor the first potential $U_1$ and the second potential $U_5$ can have mutually different signs relative to a reference potential $U_{ref}$.

In accordance with a seventeenth aspect referring to the fourteenth aspect, in the MEMS sensor the first potential $U_1$ and the second potential $U_5$ can be DC voltage potentials and can be identical in terms of absolute value within a tolerance range of 50%.

In accordance with an eighteenth aspect referring to the fourteenth aspect, in the MEMS sensor a ratio of a first distance $38_1$ between the first stator electrode element 16a and the first movable electrode $14_1$ and a second distance $38_2$ between the second stator electrode element 16b and the second movable electrode $14_2$ can correspond to a ratio in terms of absolute value between the first potential $U_1$ and the second potential $U_5$ within a tolerance range of 33%.

In accordance with a nineteenth aspect, a MEMS sensor 30 can have the following features: a MEMS arrangement 12 comprising: a first movable electrode $14_1$; a second movable electrode $14_2$, which is arranged opposite the first movable electrode $14_1$; and a stator electrode 16 arranged between the first and second movable electrodes $14_1$, $14_2$; wherein the first movable electrode $14_1$ in a rest state is arranged at a first distance $36_1$ from the stator electrode 16 and the second electrode $14_2$ in the rest state is arranged at a second distance $36_2$ from the stator electrode 16, said second distance being different than the first distance $36_1$.

In accordance with a twentieth aspect referring to the nineteenth aspect, the MEMS sensor can furthermore comprise the following features: a first bias voltage source 18 which is connected to the stator electrode 16 and which is configured to apply a first bias voltage $U_1$ to the stator electrode 16; and a common-mode read-out circuit 22 connected to the stator electrode 16 by a capacitive coupling 24; $24_1$, $24_2$ and comprising a second bias voltage source 26, which is configured to apply a second bias voltage $U_2$ to a side of the capacitive coupling 24 that faces away from the stator electrode 16.

In accordance with a twenty-first aspect, a method 100 for controlling a MEMS sensor comprising a first movable electrode; a second movable electrode arranged opposite the first movable electrode; and a stator electrode arranged between the first and second movable electrodes, can comprise the following steps: applying 110 a first bias voltage to the stator electrode; and applying 120 a second bias voltage to the stator electrode via a capacitive coupling to the stator electrode and at a side of the capacitive coupling that faces away from the stator electrode.

In accordance with a twenty-second aspect, a method 200 for providing a MEMS sensor can comprise the following steps: providing 210 a MEMS arrangement comprising: a movable electrode; a stator electrode arranged opposite the movable electrode; connecting 220 a first bias voltage source to the stator electrode, such that the first bias voltage source is configured to apply a first bias voltage to the stator electrode; and connecting 230 a common-mode read-out circuit comprising a second bias voltage source by a capacitive coupling to the stator electrode, such that the second bias voltage source is configured to apply a second bias voltage to a side of the capacitive coupling that faces away from the stator electrode.

In accordance with a twenty-third aspect, a method 300 for providing a MEMS sensor can comprise the following steps: providing 310 a MEMS arrangement comprising: a first movable electrode; a second movable electrode arranged opposite the first movable electrode; and a stator electrode arranged between the first and second movable electrodes; such that the first movable electrode in a rest state is arranged at a first distance from the stator electrode and the second electrode in the rest state is arranged at a second distance from the stator electrode, said second distance being different than the first distance.

Although some aspects have been described in association with an apparatus, it goes without saying that these aspects also constitute a description of the corresponding method, such that a block or a component of an apparatus should also be understood as a corresponding method step or as a feature of a method step. Analogously thereto, aspects that have been described in association with or as a method step also constitute a description of a corresponding block or detail or feature of a corresponding apparatus.

Depending on specific implementation requirements, exemplary embodiments of the invention can be implemented in hardware or in software. The implementation can be effected using a digital storage medium, for example a floppy disk, a DVD, a Blu-ray disk, a CD, a ROM, a PROM, an EPROM, an EEPROM, or a FLASH memory, a hard disk or some other magnetic or optical storage unit on which are stored electronically readable control signals which can interact or interact with a programmable computer system in such a way that the respective method is carried out. Therefore, the digital storage medium can be computer-readable. Some exemplary embodiments according to the invention thus comprise a data carrier having electronically readable control signals which are able to interact with a programmable computer system in such a way that one of the methods described herein is carried out.

Generally, exemplary embodiments of the present invention can be implemented as a computer program product comprising a program code, wherein the program code is effective for carrying out one of the methods when the computer program product runs on a computer. The program code can for example also be stored on a machine-readable carrier.

Other exemplary embodiments comprise the computer program for carrying out one of the methods described herein, wherein the computer program is stored on a machine-readable carrier.

In other words, one exemplary embodiment of the method according to the invention is thus a computer program comprising a program code for carrying out one of the methods described herein when the computer program runs on a computer. A further exemplary embodiment of the methods according to the invention is thus a data carrier (or a digital storage medium or a computer-readable medium) on which the computer program for carrying out one of the methods described herein is recorded.

A further exemplary embodiment of the method according to the invention is thus a data stream or a sequence of signals which constitute(s) the computer program for carrying out one of the methods described herein. The data stream or the sequence of signals can be configured for example to the effect of being transferred via a data communication connection, for example via the Internet.

A further exemplary embodiment comprises a processing device, for example a computer or a programmable logic component, which is configured or adapted to the effect of carrying out one of the methods described herein.

A further exemplary embodiment comprises a computer on which the computer program for carrying out one of the methods described herein is installed.

In some exemplary embodiments, a programmable logic component (for example a field programmable gate array, an FPGA) can be used to carry out some or all functionalities of the methods described herein. In some exemplary embodiments, a field programmable gate array can cooperate with a microprocessor in order to carry out one of the methods described herein. Generally, the methods in some exemplary embodiments are carried out on the part of an arbitrary hardware apparatus. The latter can be universally usable hardware such as a computer processor (CPU) or hardware specific to the method, such as an ASIC, for example.

The exemplary embodiments described above merely represent an illustration of the principles of the present invention. It goes without saying that modifications and variations of the arrangements and details described herein will be apparent to others skilled in the art. Therefore, the intention is for the invention to be restricted only by the scope of protection of the following patent claims and not by the specific details that have been presented herein on the basis of the description and the explanation of the exemplary embodiments.

What is claimed is:

1. A micro-electro-mechanical (MEMS) sensor comprising:
    a MEMS arrangement comprising:
        a movable electrode;
        a stator electrode, arranged opposite the movable electrode;
        a first bias voltage source, which is connected to the stator electrode and which is configured to apply a first bias voltage to the stator electrode; and
        a common-mode read-out circuit connected to the stator electrode by a capacitive coupling and comprising a second bias voltage source, which is configured to apply a second bias voltage to a side of the capacitive coupling that faces away from the stator electrode.

2. The MEMS sensor as claimed in claim 1, wherein the movable electrode is a first movable electrode, the MEMS arrangement further comprises a second movable electrode arranged opposite the first movable electrode, and the stator electrode is arranged between the first and second movable electrodes.

3. The MEMS sensor as claimed in claim 2, wherein the first movable electrode and the second movable electrodes are configured to be connected to a common first potential, and the stator electrode is configured to be connected to a second potential different from the common first potential.

4. The MEMS sensor as claimed in claim 3, wherein the common first potential is a reference potential of the MEMS sensor.

5. The MEMS sensor as claimed in claim 2, wherein the first movable electrode and the second movable electrode are movable along the same direction.

6. The MEMS sensor as claimed in claim 2, wherein the first movable electrode and the second movable electrode are mechanically connected to one another through a plane of the stator electrode, and configured to carry out a simultaneous movement.

7. The MEMS sensor as claimed in claim 2, wherein the common-mode read-out circuit is configured to detect a first capacitance value between the first movable electrode and the stator electrode and detect a second capacitance value between the second movable electrode and the stator electrode.

8. The MEMS sensor as claimed in claim 1, wherein at least one of the movable electrode and the stator electrode are held by a substrate configured to be connected to a reference potential of the MEMS sensor.

9. The MEMS sensor as claimed in claim 1, wherein at least one of the movable electrode and the stator electrode are held by a substrate, wherein the substrate is electrically insulated from the movable electrode and an environment of the substrate.

10. The MEMS sensor as claimed in claim 1, wherein the first bias voltage source is configured to apply the first bias voltage with a potential of at least 3 V, and wherein the second bias voltage source is configured to apply the second bias voltage with at most 2.5 V.

11. The MEMS sensor as claimed in claim 1, wherein the first bias voltage and the second bias voltage are DC voltages.

12. The MEMS sensor as claimed in claim 1, wherein the movable electrode is a first movable electrode, the MEMS arrangement further comprises a second movable electrode arranged opposite the first movable electrode, and the stator electrode is arranged between the first and second movable electrodes; and
    wherein the first movable electrode in a rest state is arranged at a first distance from the stator electrode and the second movable electrode in the rest state is arranged at a second distance from the stator electrode, said second distance being different than the first distance.

13. The MEMS sensor as claimed in claim 12, wherein a quotient of the first distance and the second distance has a value of at least 1.1.

14. The MEMS sensor as claimed in claim 1, wherein the movable electrode is a first movable electrode, the MEMS arrangement further comprises a second movable electrode arranged opposite the first movable electrode, and wherein the stator electrode is arranged between the first movable electrode and the second movable electrode;
    wherein the stator electrode has a first stator electrode element which is arranged in a manner facing the first movable electrode and an opposite second stator electrode element which is arranged in a manner facing the second movable electrode, wherein the MEMS sensor is configured to apply a mutually different potential to the first stator electrode element and the second stator electrode element.

15. The MEMS sensor as claimed in claim 14, wherein the MEMS sensor is configured to detect a first movement of the first movable electrode relative to the first stator electrode element and a second movement of the second movable electrode relative to the second stator electrode element.

16. The MEMS sensor as claimed in claim 14, wherein a first potential of the first stator electrode element and a second potential of the second stator electrode element have mutually different signs relative to a reference potential.

17. The MEMS sensor as claimed in claim 14, wherein a first potential of the first stator electrode element and a second potential of the second stator electrode element are DC voltage potentials and are identical in terms of absolute value within a tolerance range of 50%.

18. The MEMS sensor as claimed in claim 14, wherein a ratio of a first distance between the first stator electrode element and the first movable electrode and a second distance between the second stator electrode element and the second movable electrode corresponds to a ratio in terms of absolute value between a first potential of the first stator electrode element and a second potential of the second stator electrode element within a tolerance range of 33%.

19. A method for providing a micro-electro-mechanical (MEMS) sensor comprising the following steps:
providing a MEMS arrangement comprising:
a movable electrode,
a stator electrode arranged opposite the movable electrode,
connecting a first bias voltage source to the stator electrode, such that the first bias voltage source is configured to apply a first bias voltage to the stator electrode, and
connecting a common-mode read-out circuit comprising a second bias voltage source by a capacitive coupling to the stator electrode, such that the second bias voltage source is configured to apply a second bias voltage to a side of the capacitive coupling that faces away from the stator electrode.

20. A method of operating a micro-electro-mechanical (MEMS) sensor having a MEMS arrangement comprising a movable electrode, a stator electrode, arranged opposite the movable electrode; a first bias voltage source; and a common-mode read-out circuit connected to the stator electrode by a capacitive coupling and comprising a second bias voltage source, the method comprising:
applying, by the first bias voltage source, a first bias voltage to the stator electrode; and
applying, by the second bias voltage source, a second bias voltage to a side of the capacitive coupling that faces away from the stator electrode.

21. A method of forming a micro-electro-mechanical (MEMS) sensor comprising a MEMS arrangement, the method comprising
forming a movable electrode;
forming a stator electrode, arranged opposite the movable electrode;
forming a first bias voltage source, which is connected to the stator electrode and which is configured to apply a first bias voltage to the stator electrode; and
forming a common-mode read-out circuit connected to the stator electrode by a capacitive coupling and comprising a second bias voltage source, which is configured to apply a second bias voltage to a side of the capacitive coupling that faces away from the stator electrode.

* * * * *